United States Patent
Park et al.

(10) Patent No.: US 9,923,809 B2
(45) Date of Patent: Mar. 20, 2018

(54) DATA TRANSMISSION APPARATUS, DATA RECEPTION APPARATUS, DATA TRANSMISSION AND RECEPTION SYSTEM

(71) Applicants: SK hynix Inc., Icheon (KR); POSTECH ACADEMY-INDUSTRY FOUNDATION, Pohang (KR)

(72) Inventors: Hong June Park, Pohang (KR); Soo Min Lee, Hwasung (KR); Yong Ju Kim, Seoul (KR); Hae Kang Jung, Gwangmyeong (KR)

(73) Assignees: SK HYNIX INC., Icheon (KR); POSTECH ACADEMY-INDUSTRY FOUNDATION, Pohang (KR)

( * ) Notice: Subject to any disclaimer, the term of this patent is extended or adjusted under 35 U.S.C. 154(b) by 0 days.

(21) Appl. No.: 15/245,514

(22) Filed: Aug. 24, 2016

(65) Prior Publication Data

US 2017/0085466 A1    Mar. 23, 2017

(30) Foreign Application Priority Data

Sep. 22, 2015  (KR) .......................... 10-2015-0133522

(51) Int. Cl.
| | | |
|---|---|---|
| *H04L 12/707* | (2013.01) | |
| *H04L 25/49* | (2006.01) | |
| *H04B 15/00* | (2006.01) | |
| *H04B 1/40* | (2015.01) | |
| *H04B 3/32* | (2006.01) | |
| *H04L 25/02* | (2006.01) | |
| *H04L 25/08* | (2006.01) | |

(52) U.S. Cl.
CPC .......... *H04L 45/24* (2013.01); *H04L 25/4919* (2013.01); *H04B 1/40* (2013.01); *H04B 3/32* (2013.01); *H04B 15/005* (2013.01); *H04L 25/0274* (2013.01); *H04L 25/08* (2013.01); *H04L 25/4917* (2013.01); *H04L 25/4923* (2013.01)

(58) Field of Classification Search
CPC . H04L 45/24; H04L 25/4917; H04L 25/4919; H04L 25/4923; H04B 1/40; H04B 15/005; H04B 3/32; H03M 5/16
See application file for complete search history.

(56) References Cited

U.S. PATENT DOCUMENTS

| | | | |
|---|---|---|---|
| 6,898,201 B1 * | 5/2005 | James ................. | H04L 25/4908 341/58 |
| 9,014,295 B1 * | 4/2015 | Cronie ................ | H04L 25/4925 375/289 |

(Continued)

FOREIGN PATENT DOCUMENTS

| | | |
|---|---|---|
| JP | 2005-175799 A | 6/2005 |
| JP | 2010-28579 A | 2/2010 |

(Continued)

*Primary Examiner* — Sophia Vlahos

(57) ABSTRACT

A data transmission and reception system may include: a data transmission apparatus configured to generate N Tx signals having discrete levels using N binary data, and output the N Tx signals to N single-ended signal lines, respectively, where N is a natural number equal to or larger than 2; and a data reception apparatus configured to receive the N Tx signals transmitted in parallel through the single-ended signal lines, and restore the N binary data by comparing the received N Tx signals to each other.

17 Claims, 11 Drawing Sheets

(56) References Cited

U.S. PATENT DOCUMENTS

| | | | |
|---|---|---|---|
| 2003/0095606 A1* | 5/2003 | Horowitz | H04L 25/4919 375/286 |
| 2007/0046389 A1 | 3/2007 | Dreps et al. | |
| 2009/0224798 A1 | 9/2009 | Yamaguchi | |
| 2010/0309964 A1* | 12/2010 | Oh | G06F 13/4243 375/219 |
| 2013/0051162 A1* | 2/2013 | Amirkhany | G11C 7/1006 365/189.011 |
| 2014/0254642 A1* | 9/2014 | Fox | H04L 25/028 375/219 |
| 2014/0348214 A1* | 11/2014 | Sengoku | H04L 7/04 375/147 |
| 2015/0333940 A1* | 11/2015 | Shokrollahi | H04L 25/0272 375/296 |

FOREIGN PATENT DOCUMENTS

| | | |
|---|---|---|
| JP | 2010-268180 A | 11/2010 |
| KR | 2008-0089868 A | 10/2008 |

* cited by examiner

DATA TRANSMISSION APPARATUS, DATA RECEPTION APPARATUS, DATA TRANSMISSION AND RECEPTION SYSTEM

CROSS-REFERENCE TO RELATED APPLICATIONS

The present application claims priority of Korean Patent Application No. 10-2015-0133522, filed on Sep. 22, 2015, which is incorporated herein by reference in its entirety.

BACKGROUND

1. Field

Exemplary embodiments of the present disclosure relate to a data transmission and reception system, and more particularly, to a data transmission apparatus, a data reception apparatus, and a data transmission and reception system, which are capable of improving the technology for transmitting signals in parallel through single-ended signal lines.

2. Description of the Related Art

Electronic devices such as personal computers and smart phones include a memory element which is electrically connected to a central processing unit (CPU) through a memory controller.

For transmission and reception of binary data between the memory element and the memory controller, parallel data signal lines are used. The parallel data signal lines are used to transmit high-volume data at the same time, and the number of parallel data signal lines may be four, eight, or 32 in order to transmit data at a high speed.

In order to reduce the number of parallel data signal lines and the number of pins included in the memory element, a single-ended signaling system for transmitting one data through one signal line is mainly used instead of a differential signaling system for transmitting one data through two signal lines.

The single-ended signaling system uses a smaller number of signal lines than the differential signaling system. However, in the single-ended signaling system, a receiver stage has to use a reference signal to restore data using a received signal, and thus, a circuit configuration of the receiver stage may become complex. Furthermore, the single-ended signaling system may be vulnerable to a supply voltage noise and EMI (Electromagnetic Interference).

In addition, a single-ended signal line generally has a similar frequency characteristic to a low pass filter. Thus, a high-frequency signal component of data transmitted through the single-ended signal line may have a smaller magnitude than a low-frequency signal component of the data. Therefore, a data reception apparatus may have difficulties in restoring the data.

SUMMARY

Various embodiments are directed to technologies for transmitting data using a single-ended signaling system in order to reduce the number of data transmission signal lines and the number of pins included in a DRAM chip.

Also, various embodiments are directed to a data reception apparatus and a data transmission and reception system, which transmit and receive data through a single-ended signaling system and include a reception stage with a simple circuit configuration.

Also, various embodiments are directed to a data transmission apparatus and a data transmission and reception system, which generate transmission (Tx) signals having discrete levels corresponding to input data and transmit the Tx signals through single-ended signal lines, such that the Tx signals are less influenced by a supply voltage noise and EMI.

Also, various embodiments are directed to a data transmission apparatus and a data transmission and reception system, which amplify high-frequency components of Tx signals to be transmitted through single-ended signal lines, such that a data reception apparatus can easily restore data.

In an embodiment, A data transmission apparatus, comprising: an encoder configured to generate N N-bit data based on N binary data, where N is a natural number equal to or larger than 2; and a transmission driver configured to generate N transmission (Tx) signals having discrete levels and corresponding to the N N-bit data, and output the N Tx signals to N single-ended signal lines.

In an embodiment, a data reception apparatus, comprising: a reception driver configured to receive N Tx signals having discrete levels and being transmitted in parallel through N single-ended signal lines, and to generate decoded data having a bit number corresponding to the number of cases in which the N Tx signals are compared to each other, wherein N is a natural number equal to or larger than 2; and a decoder configured to generate N binary data by combining bits of the decoded data.

The reception driver may compare the N Tx signals to each other using differential comparators.

The reception driver may receive four Tx signals, and generates 6-bit decoded data by comparing the four Tx signals to each other.

The decoder may comprise: a first multiplexer configured to select one of first and second bits of the decoded data; a second multiplexer configured to select one of third and fourth bits of the decoded data; and a logic circuit configured to perform an XOR operation on fifth and sixth bits of the decoded data, wherein outputs of the first and second multiplexers are determined in response to an output of the logic circuit, and wherein the outputs of the first and second multiplexers and the fifth and sixth bits are output as four binary data.

In an embodiment, a data transmission apparatus configured to generate N Tx signals having discrete levels using N binary data, and output the N Tx signals to N single-ended signal lines, respectively, where N is a natural number equal to or larger than 2; and a data reception apparatus configured to receive the N Tx signals transmitted in parallel through the single-ended signal lines, and restore the N binary data by comparing the received N Tx signals to each other.

DETAILED DESCRIPTION

Figure 1:
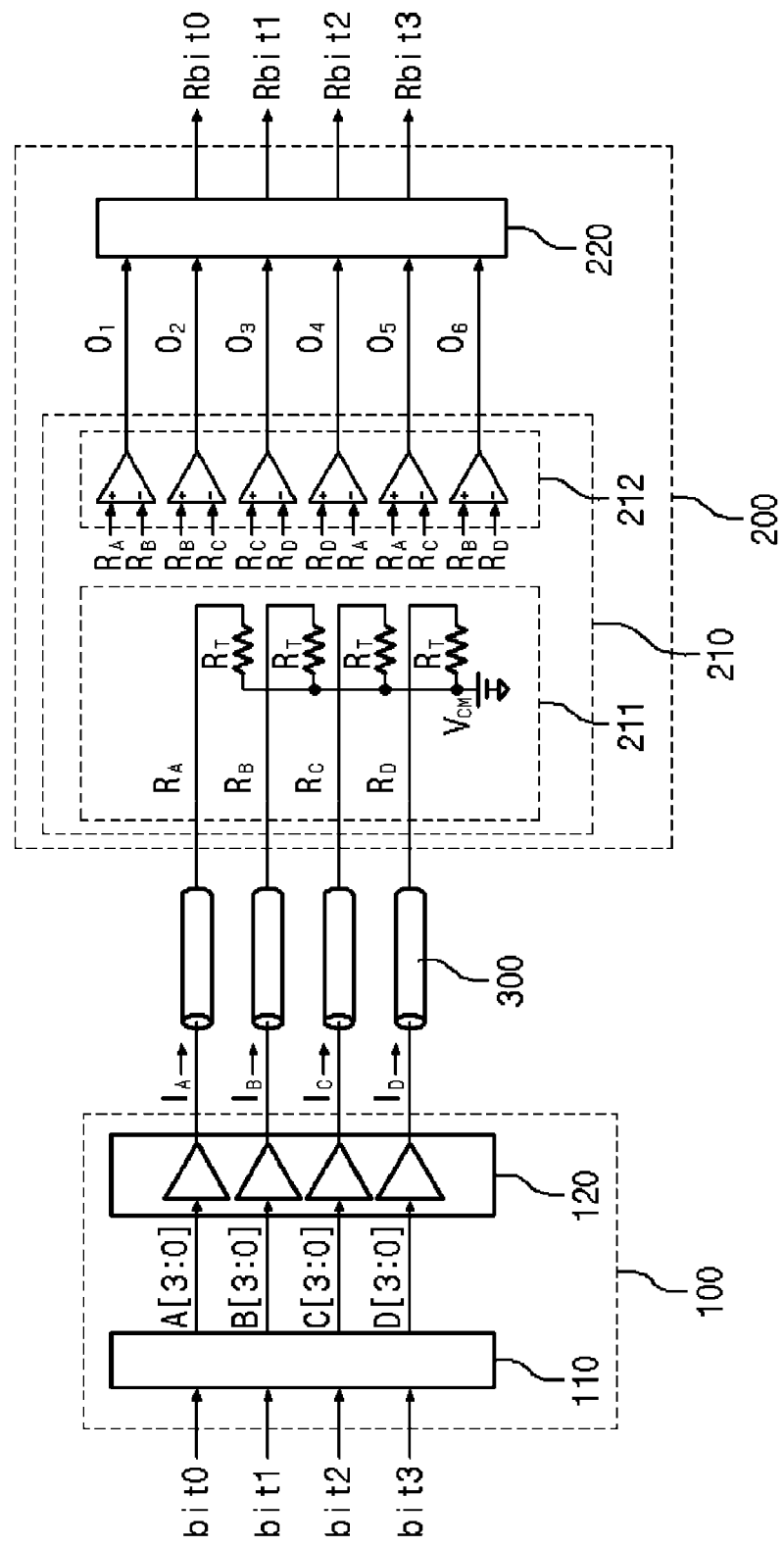
FIG. 1 illustrates a data transmission and reception system in accordance with an embodiment of the present disclosure.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

While the present invention is described, detailed descriptions related to publicly known functions or configurations will be ruled out in order not to unnecessarily obscure subject matters of the present invention.

Furthermore, although the terms such as first and second are used herein to describe various elements, these elements should not be limited by these terms, and the terms are used only to distinguish one element from another element.

FIG. 1 illustrates a data transmission and reception system in accordance with an embodiment of the present disclosure. The data transmission and reception system includes a data transmission apparatus 100 and a data reception apparatus 200. The data transmission apparatus 100 transmits data to the data reception apparatus 200 using transmission signal lines 300. The transmission signal lines 300 may include a plurality of single-ended signal lines, and signals transmitted through the transmission signal lines 300 will be referred to as transmission (Tx) signals.

The data transmission apparatus 100 converts N binary data having no correlation therebetween into N N-bit data having correlation therebetween, N being a natural number equal to or larger than 2. The data transmission apparatus 100 generates N Tx signals corresponding to the N N-bit data, and outputs the N Tx signals to the N single-ended signal lines 300, respectively. The N Tx signals have discrete levels.

The correlation among the N N-bit data may be defined in various manners. In the present embodiment, the correlation may indicate that data values have discrete levels. That is, according to the correlation, specific data of the N N-bit data does not have the same value as another data of the N N-bit data.

The data reception apparatus 200 receives the N Tx signals transmitted in parallel through the single-ended signal lines 300, and restores the N Tx signals into N binary data by comparing the N Tx signals to each other.

One of the data transmission apparatus 100 and the data reception apparatus 200 may correspond to a memory element, and the other may correspond to a memory controller.

For convenience of description, in the embodiment illustrated in FIG. 1, N is defined as 4. The data transmission apparatus 100 receives four binary data bit0 to bit3 from an external device, and outputs four Tx signals $I_A$ to $I_D$, which have discrete levels, to the single-ended signal lines 300 in parallel. Each of the binary data bit0 to bit3 may have a binary value expressed as "0" or "1".

The data transmission apparatus 100 includes an encoder 110 and a transmission driver 120.

The encoder 110 converts the four binary data bit0 to bit3 into four 4-bit data A[3:0], B[3:0], C[3:0], and D[3:0].

The transmission driver 120 generates the four Tx signals $I_A$ to $I_D$ corresponding to the four 4-bit data A[3:0], B[3:0], C[3:0], and D[3:0] provided from the encoder 110, respectively, and outputs the four Tx signals $I_A$ to $I_D$ in parallel to the four transmission signal lines 300. The four Tx signals $I_A$ to $I_D$ may be current signals.

The data reception apparatus 200 receives the four Tx signals $I_A$ to $I_D$ transmitted in parallel through the four transmission signal lines 300 and having different levels from each other, and converts the four Tx signals $I_A$ to $I_D$ into four voltages $R_A$ to $R_D$, respectively. The data reception apparatus 200 generates decoded data $O_1$ to $O_6$ by comparing the four voltages $R_A$ to $R_D$ to each other, and generates binary data Rbit1 to Rbit3 based on the decoded data $O_1$ to $O_6$, the binary data Rbit1 to Rbit3 having the same values as the four binary data bit0 to bit3, respectively.

The data reception apparatus 200 includes a reception driver 210 and a decoder 220.

The reception driver 210 may generate decoded data. The number of decoded data corresponds to the number of all cases in which Tx signals are compared to each other. In the present embodiment, the reception driver 210 generates the six decoded data $O_1$ to $O_6$ corresponding to six cases in which every two signals of the four voltages $R_A$ to $R_D$ are compared to each other.

The reception driver 210 includes a conversion circuit 211 and a comparison circuit 212.

The conversion circuit 211 includes four termination resistors $R_T$ coupled to the respective four Tx signal lines 300, and receives the four Tx signals $I_A$ to $I_D$ in parallel through the four Tx signal lines 300. The received four Tx signals $I_A$ to $I_D$ are converted into the four voltages $R_A$ to $R_D$ by the four termination resistors $R_T$, respectively, and the four voltages $R_A$ to $R_D$ are provided to the comparison circuit 212. At this time, the voltages $R_A$ to $R_D$ may have levels proportional to current magnitudes of the Tx signals $I_A$ to $I_D$, respectively.

The conversion circuit 211 further includes a common voltage source $V_{CM}$ coupled to the four termination resistors $R_T$ for impedance matching. The common voltage source $V_{CM}$ is disposed between the four termination resistors $R_T$ and a ground voltage terminal.

The comparison circuit 212 generates the six decoded data $O_1$ to $O_6$ using the four voltages $R_A$ to $R_D$ output from the conversion circuit 211. The comparison circuit 212 includes six comparators that compare the four voltages $R_A$ to $R_D$ by two voltages in order to deal with the number of all cases in which the four voltages $R_A$ to $R_D$ are compared by two voltages. When two exclusive voltages of the four voltages $R_A$ to $R_D$ are input, each of the comparators outputs a differentially amplified signal as decoded data $O_i$, i being in a range of 1 to 6.

More specifically, the comparison circuit 212 may include first to sixth comparators. The first comparator outputs a comparison result between the voltages $R_A$ and $R_B$ as the decoded data $O_1$, the second comparator outputs a comparison result between the voltages $R_B$ and $R_C$ as the decoded data $O_2$, the third comparator outputs a comparison result between the voltages $R_C$ and $R_D$ as the decoded data $O_3$, the fourth comparator outputs a comparison result between the voltages $R_D$ and $R_A$ as the decoded data $O_4$, the fifth comparator outputs a comparison result between the voltages $R_A$ and $R_C$ as the decoded data $O_5$, and the sixth comparator outputs a comparison result between the voltages $R_B$ and $R_D$ as the decoded data $O_6$.

Each of the comparators included in the comparison circuit 212 outputs data corresponding to a logic high level or "1" when a voltage applied to a positive terminal (+) is higher than a voltage applied to a negative terminal (−), and outputs data corresponding to a logic low level or "0" when a voltage applied to the negative terminal (−) is higher than a voltage applied to the positive terminal (+).

TABLE 1

| Input data | | | | Current levels of Tx signals | | | | Decoded data | | | | | |
|---|---|---|---|---|---|---|---|---|---|---|---|---|---|
| bit3 | bit2 | bit1 | bit0 | $I_A$ | $I_B$ | $I_C$ | $I_D$ | $O_1$ | $O_2$ | $O_3$ | $O_4$ | $O_5$ | $O_6$ |
| 0 | 0 | 0 | 0 | −3I | −I | +I | +3I | 0 | 0 | 0 | 1 | 0 | 0 |
| 0 | 0 | 0 | 1 | −3I | −I | +3I | +I | 0 | 0 | 1 | 1 | 0 | 0 |
| 0 | 0 | 1 | 0 | −I | −3I | +I | +3I | 1 | 0 | 0 | 1 | 0 | 0 |
| 0 | 0 | 1 | 1 | −I | −3I | +3I | +I | 1 | 0 | 1 | 1 | 0 | 0 |
| 0 | 1 | 0 | 0 | −I | +I | +3I | −3I | 0 | 0 | 1 | 0 | 0 | 1 |
| 0 | 1 | 0 | 1 | −3I | +I | +3I | −I | 0 | 0 | 1 | 1 | 0 | 1 |
| 0 | 1 | 1 | 0 | −I | +3I | +I | −3I | 0 | 1 | 1 | 0 | 0 | 1 |
| 0 | 1 | 1 | 1 | −3I | +3I | +I | −I | 0 | 1 | 1 | 1 | 0 | 1 |
| 1 | 0 | 0 | 0 | +3I | −3I | −I | +I | 1 | 0 | 0 | 0 | 1 | 0 |
| 1 | 0 | 0 | 1 | +I | −3I | −I | +3I | 1 | 0 | 0 | 1 | 1 | 0 |
| 1 | 0 | 1 | 0 | +3I | −I | −3I | +I | 1 | 1 | 0 | 0 | 1 | 0 |
| 1 | 0 | 1 | 1 | +I | −I | −3I | +3I | 1 | 1 | 0 | 1 | 1 | 0 |
| 1 | 1 | 0 | 0 | +I | +3I | −3I | −I | 0 | 1 | 0 | 0 | 1 | 1 |
| 1 | 1 | 0 | 1 | +I | +3I | −I | −3I | 0 | 1 | 1 | 0 | 1 | 1 |
| 1 | 1 | 1 | 0 | +3I | +I | −3I | −I | 1 | 1 | 0 | 0 | 1 | 1 |
| 1 | 1 | 1 | 1 | +3I | +I | −I | −3I | 1 | 1 | 1 | 0 | 1 | 1 |

Table 1 shows an example of the four binary data bit0 to bit3, the four Tx signals $I_A$ to $I_D$ that are output from the data transmission apparatus 100 and have different levels from each other, and the decoded data $O_1$ to $O_6$ which are generated by the reception driver 210 using the four Tx signals $I_A$ to $I_D$. In Table 1, the four Tx signals $I_A$ to $I_D$ have discrete levels corresponding to all unique combinations of the binary data bit0 to bit3.

For example, when the four binary data bit0, bit1, bit2, and bit3 have binary values of (0, 0, 1, 0), the data transmission apparatus 100 generates the four Tx signals $I_A$, $I_B$, $I_C$, and $I_D$ having current levels of (−I, −3I, +I, +3I), and the generated Tx signals $I_A$, $I_B$, $I_C$, and $I_D$ are transmitted in parallel through the four transmission signal lines 300 to the data reception apparatus 200. The reception driver 210 receives the four Tx signals $I_A$, $I_B$, $I_C$, and $I_D$ having the current levels of (−I, −3I, +I, +3I). The conversion circuit 211 generates the voltages $R_A$, $R_B$, $R_C$, and $R_D$ in response to the four Tx signals $I_A$, $I_B$, $I_C$, and $I_D$, respectively, and the comparison circuit 212 generates the decoded data $O_1$ to $O_6$, respectively having binary values of (1, 0, 0, 1, 0, 0), based on the voltages $R_A$ to $R_D$.

In the above-described example, the conversion circuit 211 generates the voltages $R_A$, $R_B$, $R_C$, and $R_D$ having voltage levels corresponding to the magnitudes of the four Tx signals $I_A$, $I_B$, $I_C$, and $I_D$, respectively. The comparison circuit 212 generates "1" or "0" corresponding to a difference between every two voltages of the voltages $R_A$, $R_B$, $R_C$, and $R_D$ as each bit of the decoded data $O_1$ to $O_6$.

Through the use of the conversion circuit 211 and the comparison circuit 212 as described with reference to the above example, the data reception apparatus 200 can restore the Tx signals using only the comparators, without using a reference signal.

The decoder 220 generates N binary data, e.g., Rbit0 to Rbit3, using the decoded data $O_1$ to $O_6$ generated by the comparison circuit 212 of the reception driver 210. The N binary data Rbit0 to Rbit3 have the same values as the binary data bit0 to bit3 input to the data transmission apparatus 100.

Configurations and operations of the respective components of FIG. 1 will be described in detail with reference to the accompanying drawings.

FIGS. 2A, 2B, 3A, 3B, 4A, 4B, 5A, and 5B are logic circuit diagrams illustrating the encoder 110 of FIG. 1 in accordance with an embodiment. The encoder 110 converts the four binary data bit0 to bit3 into four 4-bit data A[3:0], B[3:0], C[3:0], and D[3:0] by performing a logical operation on the four binary data bit0 to bit3.

The four binary data bit0 to bit3 input to the encoder 110 have no correlation therebetween. However, the four 4-bit data output from the encoder 110 are generated by performing a logical operation on the four binary data bit0 to bit3, and thus have correlation therebetween.

In the present embodiment, the four 4-bit data A[3:0], B[3:0], C[3:0], and D[3:0] have different values respectively corresponding to 0100, 1000, 1110, and 1101.

The four 4-bit data A[3:0], B[3:0], C[3:0], and D[3:0] are used to determine whether to turn on switches of the transmission driver 120 in order to generate the four Tx signals $I_A$ to $I_D$, which have discrete levels. In the present embodiment, it has been described that the encoder 110 converts the four binary data bit0 to bit3 into 0100, 1000, 1110, and 1101. However, embodiments are not limited thereto. The encoder 110 may be configured in various manners, so long as the encoder 110 generates four 4-bit data having different values in order to generate four Tx signals $I_A$ to $I_D$, which have discrete levels.

In accordance with the present embodiment, the encoder 110 includes logic circuits 111, 112, 113, 114, 115, 116, 117, and 118 illustrated in FIGS. 2A, 2B, 3A, 3B, 4A, 4B, 5A, and 5B, respectively.

A configuration and operation of the logic circuit 111 included in the encoder 110 will be described with reference to FIG. 2A. The logic circuit 111 serves to output data A[3] and C[2] among the four 4-bit data A[3:0], B[3:0], C[3:0], and D[3:0].

Figure 2A:
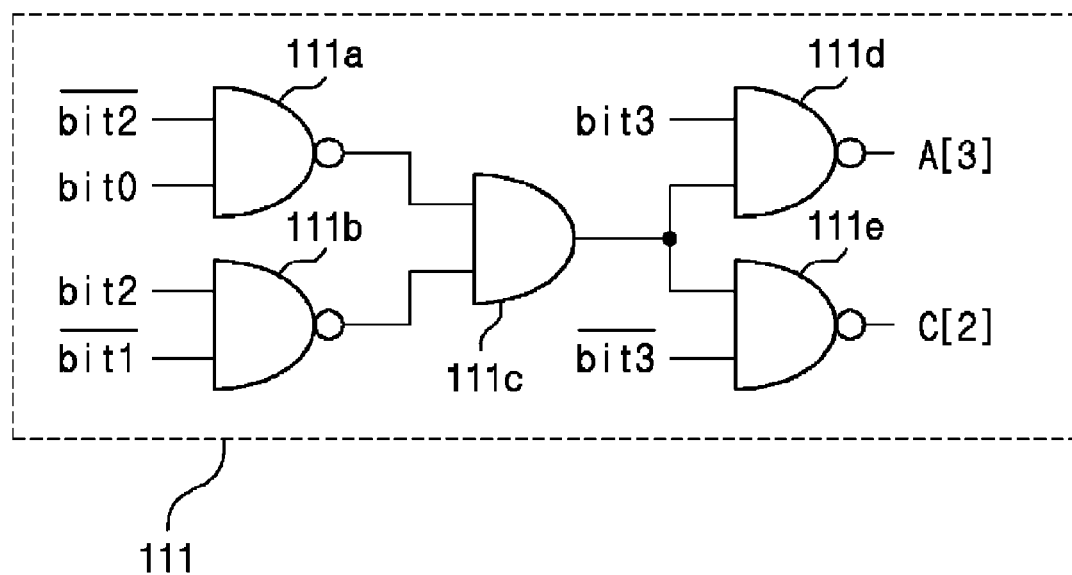
FIGS. 2A, 2B, 3A, 3B, 4A, 4B, 5A, and 5B are logic circuit diagrams illustrating an encoder of FIG. 1 in accordance with an embodiment of the present disclosure.

As illustrated in FIG. 2A, the logic circuit 111 included in the encoder 110 may include NAND gates 111a and 111b, an AND gate 111c, and NAND gates 111d and 111e. The NAND gate 111a receives two binary data bit0 and /bit2, the NAND gate 111b receives two binary data bit2 and /bit1, the AND gate 111c receives outputs of the two NAND gates 111a and 111b, the NAND gate 111d receives an output of the AND gate 111c and binary data bit3, and the NAND gate 111e receives the output of the AND gate 111c and binary data /bit3. The binary data '/bit' represents an inversion of binary data 'bit.' Through the configuration and operation of the logic circuit 111, the data A[3] and C[2] may be output.

A configuration and operation of the logic circuit 112 included in the encoder 110 will be described with reference to FIG. 2B. The logic circuit 112 serves to output data A[2] and C[3] among the four 4-bit data A[3:0], B[3:0], C[3:0], and D[3:0].

Figure 2B:
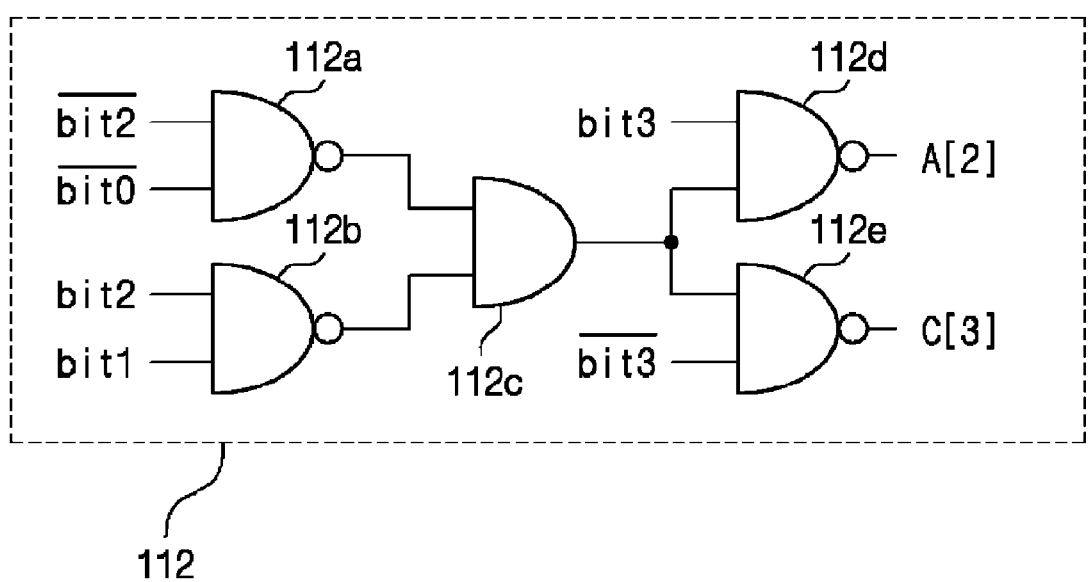

As illustrated in FIG. 2B, the logic circuit 112 included in the encoder 110 may include NAND gates 112a and 112b, an AND gate 112c, and NAND gates 112d and 112e. The NAND gate 112a receives two binary data /bit2 and /bit0, the NAND gate 112b receives two binary data bit2 and bit1, the AND gate 112c receives outputs of the two NAND gates 112a and 112b, the NAND gate 112d receives an output of the AND gate 112c and binary data bit3, and the NAND gate 112e receives the output of the AND gate 112c and binary data /bit3. Through the configuration and operation of the logic circuit 112, the data A[2] and C[3] may be output.

Figure 3A:
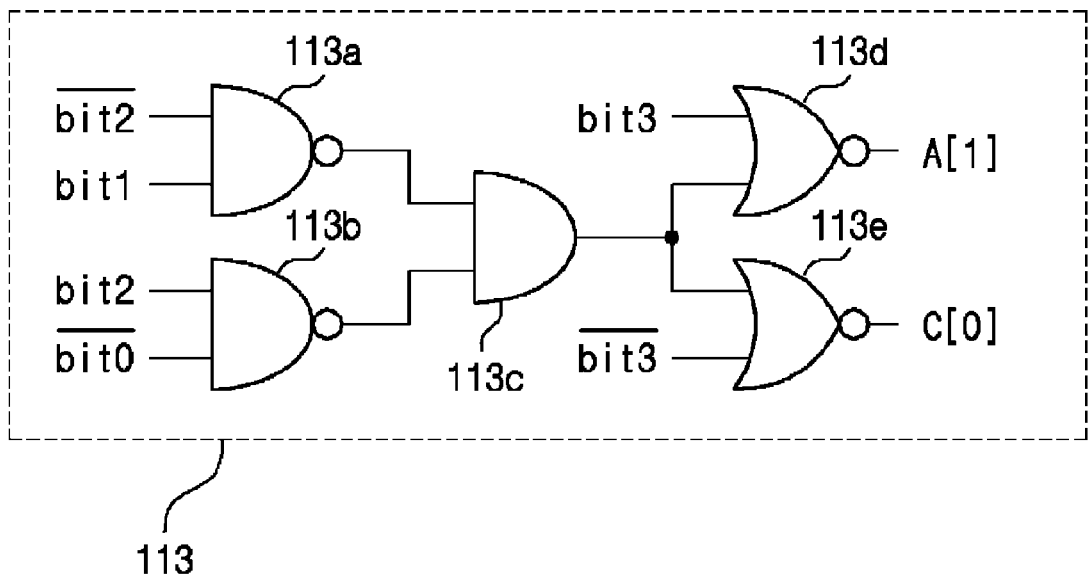

A configuration and operation of the logic circuit 113 included in the encoder 110 will be described with reference to FIG. 3A. The logic circuit 113 serves to output data A[1] and C[0] among the four 4-bit data A[3:0], B[3:0], C[3:0], and D[3:0].

The logic circuit 113 included in the encoder 110 may include NAND gates 113a and 113b, an AND gate 113c, and NOR gates 113d and 113e. The NAND gate 113a receives two binary data /bit2 and bit1, the NAND gate 113b receives two binary data bit2 and /bit0, the AND gate 113c receives outputs of the two NAND gates 113a and 113b, the NOR gate 113d receives an output of the AND gate 113c and binary data bit3, and the NOR gate 113e receives the output of the AND gate 113c and binary data /bit3. Through the configuration and operation of the logic circuit 113, the data A[1] and C[0] may be output.

Figure 3B:
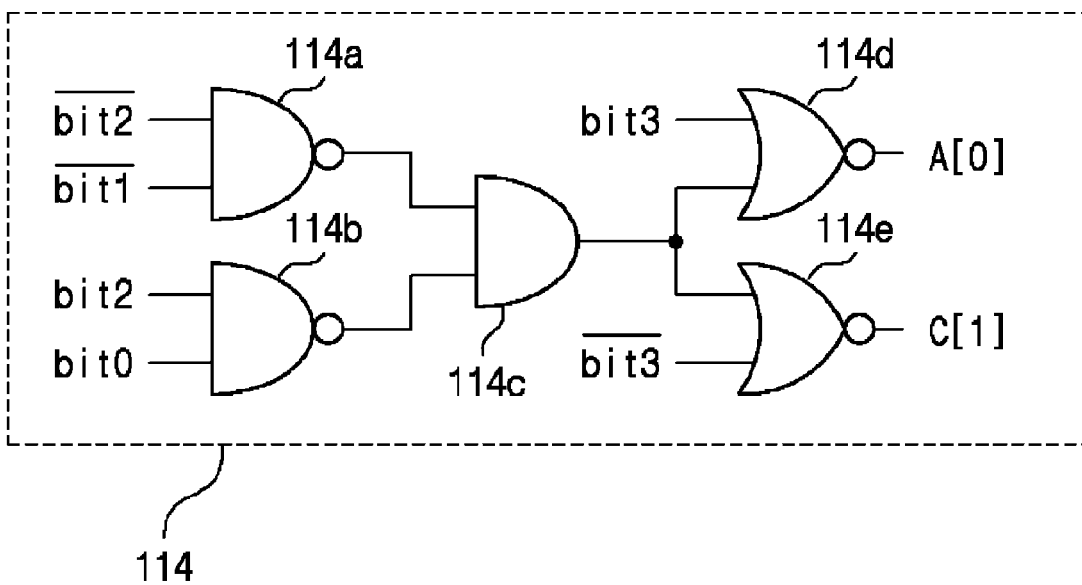

A configuration and operation of the logic circuit 114 included in the encoder 110 will be described with reference to FIG. 3B. The logic circuit 114 serves to output data A[0] and C[1] among the four 4-bit data A[3:0], B[3:0], C[3:0], and D[3:0].

The logic circuit 114 included in the encoder 110 may include NAND gates 114a and 114b, an AND gate 114c, and NOR gates 114d and 114e. The NAND gate 114a receives two binary data /bit2 and /bit1, the NAND gate 114b receives two binary data bit2 and bit0, the AND gate 114c receives outputs of the two NAND gates 114a and 114b, the NOR gate 114d receives an output of the AND gate 114c and binary data bit3, and the NOR gate 114e receives the output of the AND gate 114c and binary data /bit3. Through the configuration and operation of the logic circuit 114, the data A[0] and C[1] may be output.

Figure 4A:
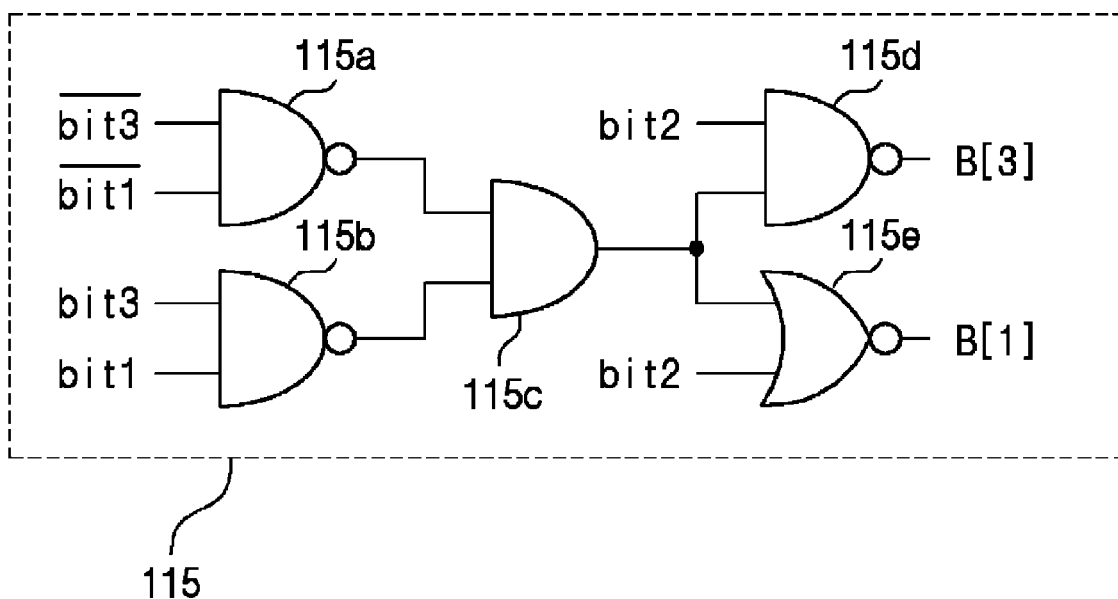

A configuration and operation of the logic circuit 115 included in the encoder 110 will be described with reference to FIG. 4A. The logic circuit 115 serves to output data B[3] and B[1] among the four 4-bit data A[3:0], B[3:0], C[3:0], and D[3:0].

The logic circuit 115 included in the encoder 110 may include NAND gates 115a and 115b, an AND gate 115c, a NAND gate 115d, and a NOR gate 115e. The NAND gate 115a receives binary data /bit3 and /bit1, the NAND gate 115b receives binary data bit3 and bit1, the AND gate 115c receives outputs of the two NAND gates 115a and 115b, the NAND gate 115d receives an output of the AND gate 115c and binary data bit2, and the NOR gate 115e receives the output of the AND gate 115c and binary data bit2. Through the configuration and operation of the logic circuit 115, the data B[3] and B[1] may be output.

Figure 4B:
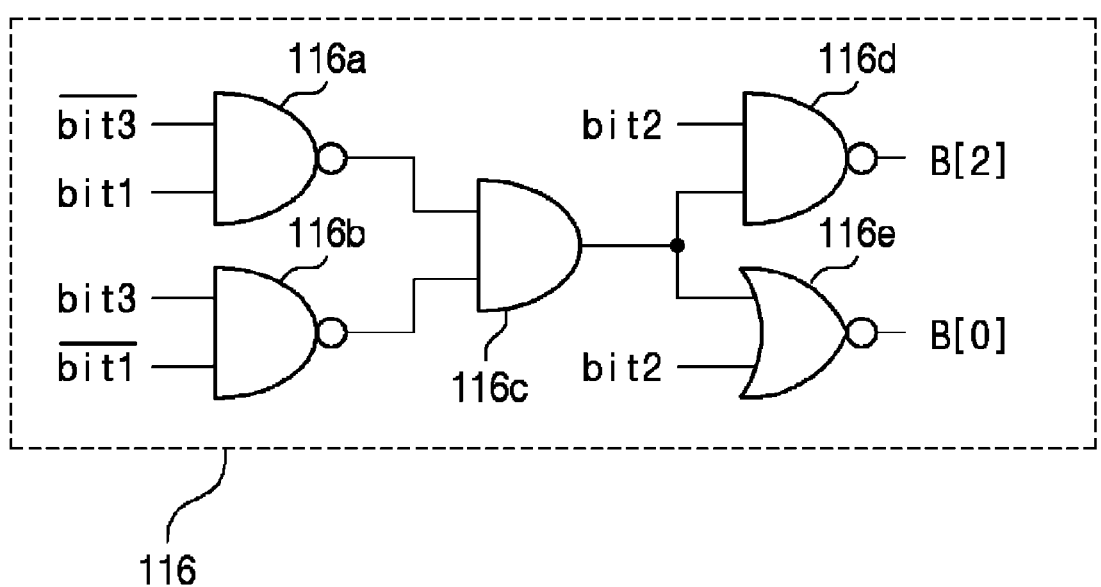

A configuration and operation of the logic circuit 116 included in the encoder 110 will be described with reference to FIG. 4B. The logic circuit 116 serves to output data B[2] and B[0] among the four 4-bit data A[3:0], B[3:0], C[3:0], and D[3:0].

The logic circuit 116 included in the encoder 110 may include NAND gates 116a and 116b, an AND gate 116c, a NAND gate 116d, and a NOR gate 116e. The NAND gate 116a receives binary data /bit3 and bit1, the NAND gate 116b receives binary data bit3 and /bit1, the AND gate 116c receives outputs of the two NAND gates 116a and 116b, the NAND gate 116d receives an output of the AND gate 116c and binary data bit2, and the NOR gate 116e receives the output of the AND gate 116c and binary data bit2. Through the configuration and operation of the logic circuit 116, the data B[2] and B[0] may be output.

Figure 5A:
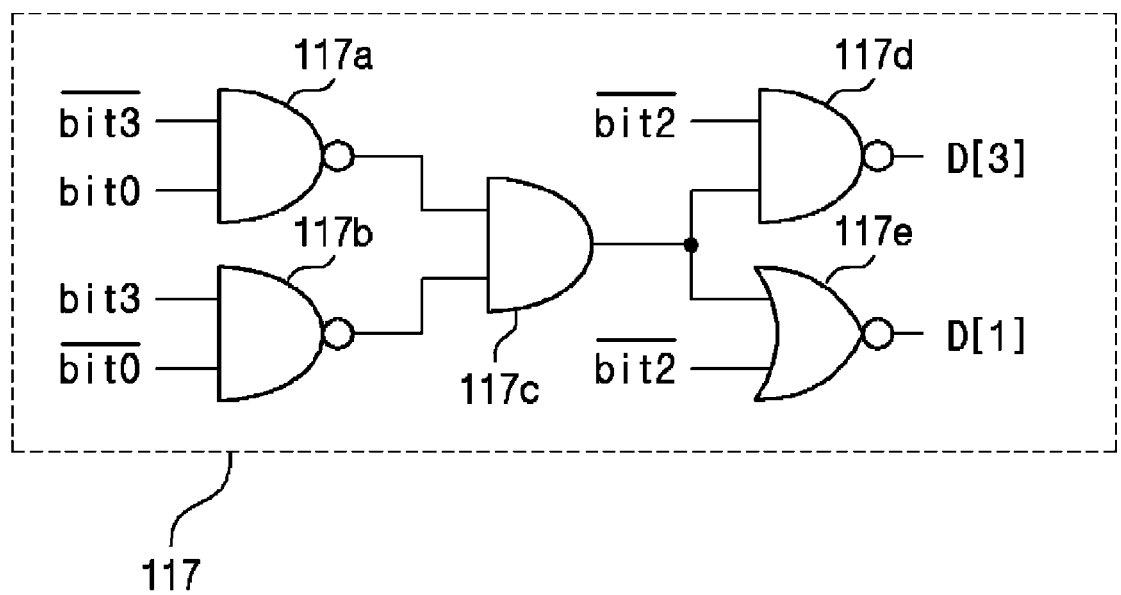

A configuration and operation of the logic circuit 117 in the encoder 110 will be described with reference to FIG. 5A. The logic circuit 117 serves to output data D[3] and D[1] among the four 4-bit data A[3:0], B[3:0], C[3:0], and D[3:0].

The logic circuit 117 included in the encoder 110 may include NAND gates 117a and 117b, an AND gate 117c, a NAND gate 117d, and a NOR gate 117e. The NAND gate 117a receives binary data /bit3 and bit0, the NAND gate 117b receives binary data bit3 and /bit0, the AND gate 117c receives outputs of the two NAND gates 117a and 117b, the NAND gate 117d receives an output of the AND gate 117c and binary data /bit2, and the NOR gate 117e receives the output of the AND gate 117c and binary data /bit2. Because of the configuration and operation of the logic circuit 117, the data D[3] and D[1] may be output.

Figure 5B:
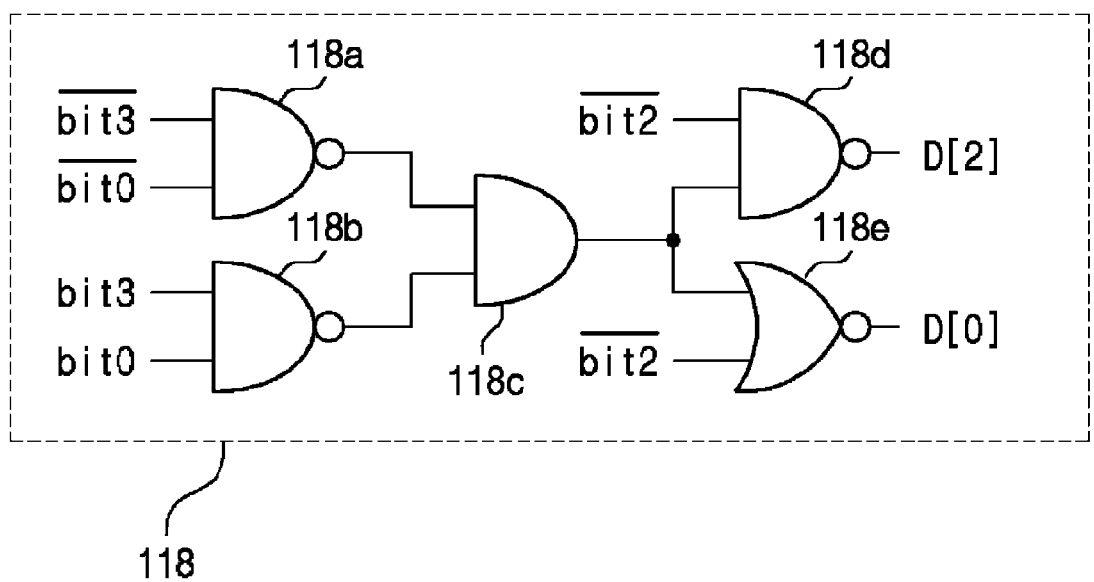

A configuration and operation of the logic circuit 118 included in the encoder 110 will be described with reference to FIG. 5B. The logic circuit 118 serves to output data D[2] and D[0] among the four 4-bit data A[3:0], B[3:0], C[3:0], and D[3:0].

The logic circuit 118 included in the encoder 110 may include NAND gates 118a and 118b, an AND gate 118c, a NAND gate 118d, and a NOR gate 118e. The NAND gate 118a receives binary data /bit3 and /bit0, the NAND gate 118b receives binary data bit3 and bit0, the AND gate 118c receives outputs of the two NAND gates 118a and 118b, the NAND gate 118d receives an output of the AND gate 118c and binary data /bit2, and the NOR gate 118e receives the output of the AND gate 118c and binary data /bit2. Because of the configuration and operation of the logic circuit 118, the data D[2] and D[0] may be output.

Figure 6:
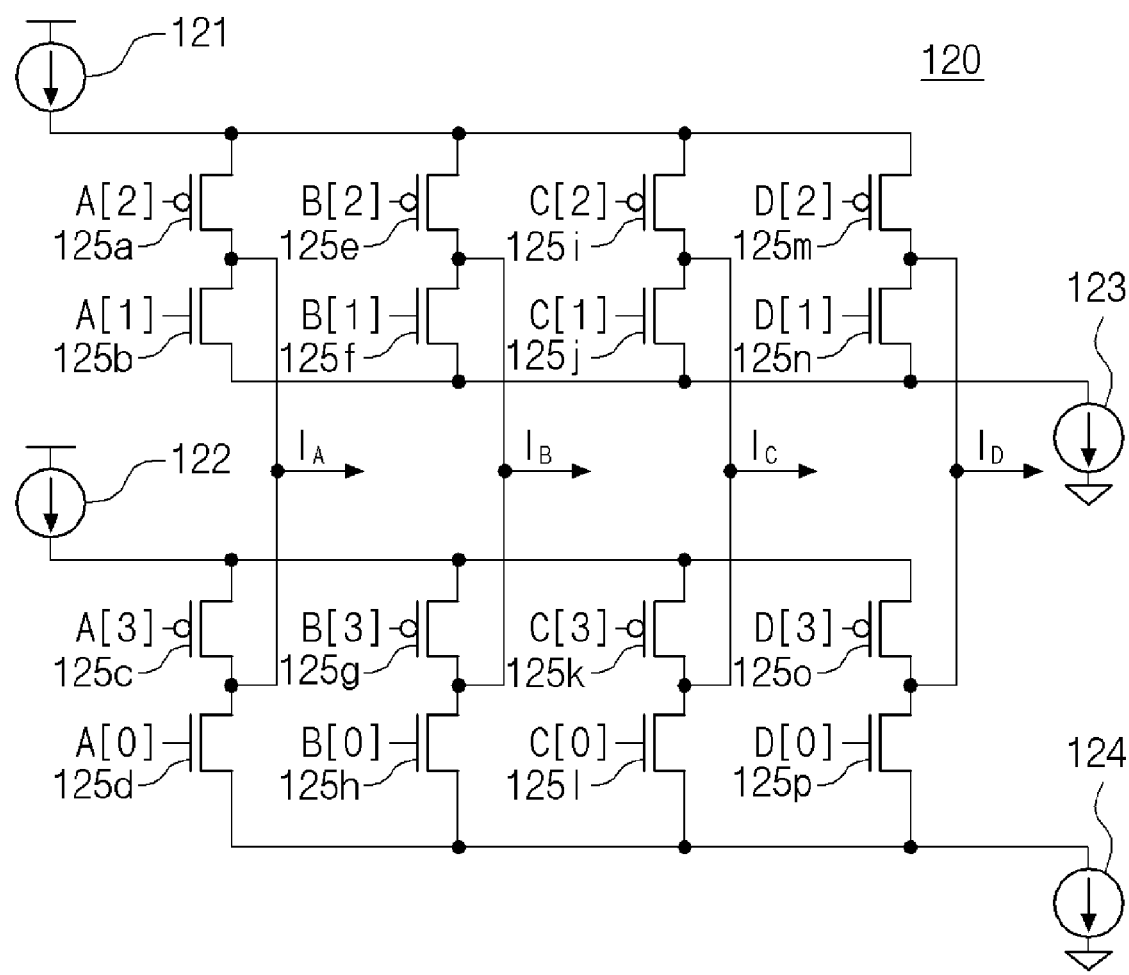
FIG. 6 is a circuit diagram illustrating a transmission driver of FIG. 1 in accordance with an embodiment of the present disclosure.

FIG. 6 is a circuit diagram illustrating the transmission driver 120 of FIG. 1 in accordance with an embodiment.

The transmission driver 120 includes first and second current sources 121 and 122, first and second sink current sources 123 and 124, and a plurality of switches 125a to 125p which determine current levels of the Tx signals $I_A$ to $I_D$ by controlling first currents of the current sources 121 and 122 and second currents of the sink current sources 123 and 124 that flow through the switches 125a to 125p.

The plurality of switches 125a to 125p is divided into four switch sets, each switch set including first to fourth switches. In each switch set, the first and second switches are coupled in series between the first current source 121 and the first sink current source 123, and the third and fourth switches are coupled in series between the second current source 122 and the second sink current source 124.

In this embodiment, the first switch set includes the switches 125a to 125d, the second switch set includes the switches 125e to 125h, the third switch set includes the switches 125i to 125l, and the fourth switch set includes the switches 125m to 125p.

Among the switches 125a to 125p, the switches 125a to 125d included in the first switch set serve to determine the current level of the Tx signal $I_A$, the switches 125e to 125h included in the second switch set serve to determine the current level of the Tx signal $I_B$, the switches 125i to 125l included the third switch set serve to determine the current level of the Tx signal $I_C$, and the switches 125m to 125p included in the fourth switch set serve to determine the current level of the Tx signal $I_D$.

The first and second current sources 121 and 122 may provide positive (+) currents having different magnitudes, and the first and second sink current sources 123 and 124 may provide negative (−) currents having different magnitudes. A difference between the currents of the first and second current sources 121 and 122 is substantially equal to a difference between the currents of the first and second sink current sources 123 and 124.

The currents generated from the respective current sources 121 to 124 may have different levels from each other, but a value obtained by adding up all of the currents may be substantially equal to zero. Furthermore, the currents of the first current source 121 and the first sink current source 123 may have substantially the same absolute value but have different polarities from each other. Likewise, the currents of the second current source 122 and the second sink current source 124 may have substantially the same absolute value but have different polarities from each other.

For example, the first current source 121 provides a current of +I, the second current source 122 provides a current of +3I, the first sink current source 123 provides a current of −I, and the first sink current source 124 provides a current of −3I, where I represents an arbitrary current level.

Thus, the sum of all the currents provided from the current sources 121 to 124 becomes zero in a steady state, and the currents (+I, +3I) of the first and second current sources 121 and 122 and the currents (−I, −3I) of the first and second sink current sources 123 and 124 have the same absolute value but have different polarities from each other.

The transmission driver 120 may output four current signals having different levels as the four Tx signals $I_A$ to $I_D$ according to operations of the switches 125a to 125p, the current signals each having a current level corresponding to any one level of +3I, +I, −I, and −3I, and the sum of the currents of the four Tx signals $I_A$ to $I_D$ being zero at all times.

As described above, the transmission driver 120 may output the four Tx signals $I_A$ to $I_D$ at discrete levels, the four Tx signals $I_A$ to $I_D$ having a uniform difference therebetween, through a pseudo differential method. That is, the four Tx signals $I_A$ to $I_D$ are separated by the same value. As the current signals are driven through the pseudo differential method, data can be transmitted while the influence caused by a supply voltage noise and EMI is minimized.

In the first switch set, the switches 125a to 125d each have a CMOS structure and receive the 4-bit data A[3:0] through gates thereof. The first and second switches 125a and 125b are coupled in series between the first current source 121 and the first sink current source 123, and output a first current through a first node coupled therebetween. The third and fourth switches 125c and 125d are coupled in series between the second current source 122 and the second sink current source 124, and output a second current through a second node coupled therebetween. The first and third switches 125a and 125c are PMOS transistors, and the second and fourth switches 125b and 125d are NMOS transistors. The first node and the second node are coupled to an output terminal through which the Tx signal $I_A$ is output.

In the first switch set, one of the switches 125a to 125d is turned on by the value of the 4-bit data A[3:0] and thus outputs the Tx signal $I_A$ having one of +3I, +I, −I, and −3I. A current level of the Tx signal $I_A$ is determined by the turn-on states of the switches 125a to 125d. The second to fourth switch sets have the same configurations as that of the first switch set. Therefore, one of the switches 125e to 125h included in the second switch set, one of the switches 125i and 125l included in the third switch set, and one of the switches 125m to 125p included in the fourth switch set are turned on by the values of the other three 4-bit data B[3:0], C[3:0], and D[3:0], respectively, and provide the Tx signals $I_B$, $I_C$, and $I_D$, respectively. That is, current levels of the Tx signals $I_B$, $I_C$, and $I_D$ are determined by the turn-on states of the switches 125e to 125h, the turn-on states of the switches 125i and 125l, and the turn-on states of the switches 125m to 125p, respectively.

At this time, each of the Tx signals $I_A$, $I_B$, $I_C$, and $I_D$ is output at a value of one of +3I, +I, −I and −3I, such that the Tx signals $I_A$, $I_B$, $I_C$, and $I_D$ have different levels from each other.

As such, when the Tx signals $I_A$ to $I_D$ are transmitted as four different current signals through the four transmission signal lines 300 in parallel according to the pseudo differential method, the total number of transmittable signal combinations is 24 (=4!). However, the number of signal combinations required for transmitting four binary data is 16 (=$2^4$). Thus, in the present embodiment, only 16 signal combinations are used as an example among the 24 transmittable signal combinations.

TABLE 2

| A[3] | A[2] | A[1] | A[0] | $I_A$ |
|---|---|---|---|---|
| 0 | 1 | 0 | 0 | +3I |
| 1 | 0 | 0 | 0 | +I |
| 1 | 1 | 1 | 0 | −I |
| 1 | 1 | 0 | 1 | −3I |

Table 2 shows an example in which the current level of the Tx signal $I_A$ is determined to be any one of +3I, +I, −I, and −3I according to bit values of the 4-bit data A[3:0]. In this embodiment shown in FIG. 6, the data A[2], A[1], A[3], and A[0] are input to the gates of the switches 125a to 125d, respectively.

Therefore, when the 4-bit data A[3:0] has a value of "0100", the switch 125c operating in response to the data A[3] is turned on and the other switches 125a, 125b, and 125d are turned off, according to the circuit diagram of FIG. 6. Thus, the current (+3I) of the current source 122 is output as the Tx signal $I_A$.

The 4-bit data A[3:0] having a different value than "0100" may be applied in the same manner to output the Tx signal $I_A$ having one of +I, −I, and −3I.

The above-described embodiment may also be applied to the other 4-bit data B[3:0], C[3:0], and D[3:0] provided from the encoder 110 to output the other Tx signals $I_B$, $I_C$, and $I_D$, respectively.

Figure 7:
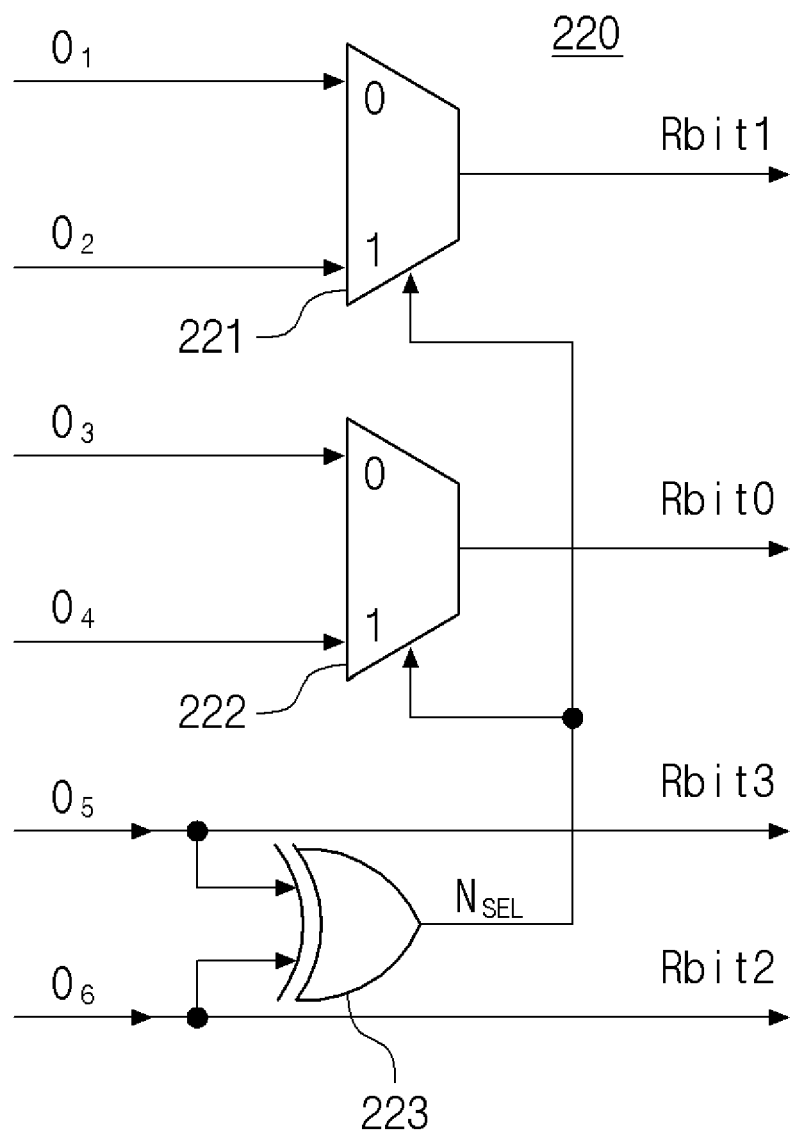
FIG. 7 illustrates a decoder of FIG. 1 in accordance with an embodiment of the present disclosure.

FIG. 7 is a block diagram illustrating the decoder 220 of FIG. 1 in accordance with an embodiment. A process in which the decoder 220 generates the four binary data Rbit0 to Rbit3 using the decoded data $O_1$ to $O_6$ received from the reception driver 210 will be described hereinafter.

The decoder 220 includes first and second multiplexers 221 and 222 and a logic circuit 223. The first multiplexer 221 selects one of the first and second bits $O_1$ and $O_2$ of the decoded data $O_1$ to $O_6$, the second multiplexer 222 selects one of the third and fourth bits $O_3$ and $O_4$ of the decoded data $O_1$ to $O_6$, and the logic circuit 223 performs an XOR operation on the fifth and sixth bits $O_5$ and $O_6$ of the decoded data $O_1$ to $O_6$. The decoder 220 determines outputs of the first and second multiplexers 221 and 222 according to an output of the logic circuit 223, and outputs the outputs of the first and second multiplexers 221 and 222 and of the fifth and sixth bits $O_5$ and $O_6$ as the restored four binary data Rbit0 to Rbit3.

The decoded data $O_5$ of the decoded data $O_1$ to $O_6$ is output as the restored binary data Rbit3, and the decoded data $O_6$ is output as the restored binary data Rbit2.

The logic circuit 223 included in the decoder 220 includes an XOR gate, and provides a signal corresponding to a logic operation result, as a select signal $N_{SEL}$, to the first and second multiplexers 221 and 222.

The first multiplexer 221 outputs one of the first and second bits $O_1$ and $O_2$ in response to the select signal $N_{SEL}$. The second multiplexer 222 outputs one of the third and fourth bits $O_3$ and $O_4$ in response to the select signal $N_{SEL}$.

Thus, when the select signal $N_{SEL}$ is "0", the first multiplexer 221 outputs the first bit $O_1$ as the restored binary data Rbit1, and the second multiplexer 222 outputs the third bit $O_3$ as the restored binary data Rbit0. On the other hand, when the select signal $N_{SEL}$ is "1", the first multiplexer 221 outputs the second bit $O_2$ as the restored binary data Rbit1, and the second multiplexer 222 outputs the fourth bit $O_4$ as the restored binary data Rbit0.

TABLE 3

| Decoded data (Decoder input) | | | | | | | Decoder output | | | |
|---|---|---|---|---|---|---|---|---|---|---|
| $O_1$ | $O_2$ | $O_3$ | $O_4$ | $O_5$ | $O_6$ | $N_{SEL}$ | Rbit3 | Rbit2 | Rbit1 | Rbit0 |
| 0 | 0 | 0 | 1 | 0 | 0 | 0 | 0 | 0 | 0 | 0 |
| 0 | 0 | 1 | 1 | 0 | 0 | 0 | 0 | 0 | 0 | 1 |
| 1 | 0 | 0 | 1 | 0 | 0 | 0 | 0 | 0 | 1 | 0 |
| 1 | 0 | 1 | 1 | 0 | 0 | 0 | 0 | 0 | 1 | 1 |
| 0 | 0 | 1 | 0 | 0 | 1 | 1 | 0 | 1 | 0 | 0 |
| 0 | 0 | 1 | 1 | 0 | 1 | 1 | 0 | 1 | 0 | 1 |
| 0 | 1 | 1 | 0 | 0 | 1 | 1 | 0 | 1 | 1 | 0 |
| 0 | 1 | 1 | 1 | 0 | 1 | 1 | 0 | 1 | 1 | 1 |
| 1 | 0 | 0 | 0 | 1 | 0 | 1 | 1 | 0 | 0 | 0 |
| 1 | 0 | 0 | 1 | 1 | 0 | 1 | 1 | 0 | 0 | 1 |
| 1 | 1 | 0 | 0 | 1 | 0 | 1 | 1 | 0 | 1 | 0 |
| 1 | 1 | 0 | 1 | 1 | 0 | 1 | 1 | 0 | 1 | 1 |
| 0 | 1 | 0 | 0 | 1 | 1 | 0 | 1 | 1 | 0 | 0 |
| 0 | 1 | 1 | 0 | 1 | 1 | 0 | 1 | 1 | 0 | 1 |
| 1 | 1 | 0 | 0 | 1 | 1 | 0 | 1 | 1 | 1 | 0 |
| 1 | 1 | 1 | 0 | 1 | 1 | 0 | 1 | 1 | 1 | 1 |

Table 3 shows an example of the correlation among the decoded data $O_1$ to $O_6$ input to the decoder 220, the select signal $N_{SEL}$ of the logic circuit 223, and the restored binary data Rbit0 to Rbit3.

Referring to Tables 1 and 3, the binary data bit0 to bit3 of Table 1 are processed by the data transmission apparatus 100, transmitted in parallel through the single-ended signal lines 300, and restored into the binary data of Table 3 by the data reception apparatus 200.

Figure 8:
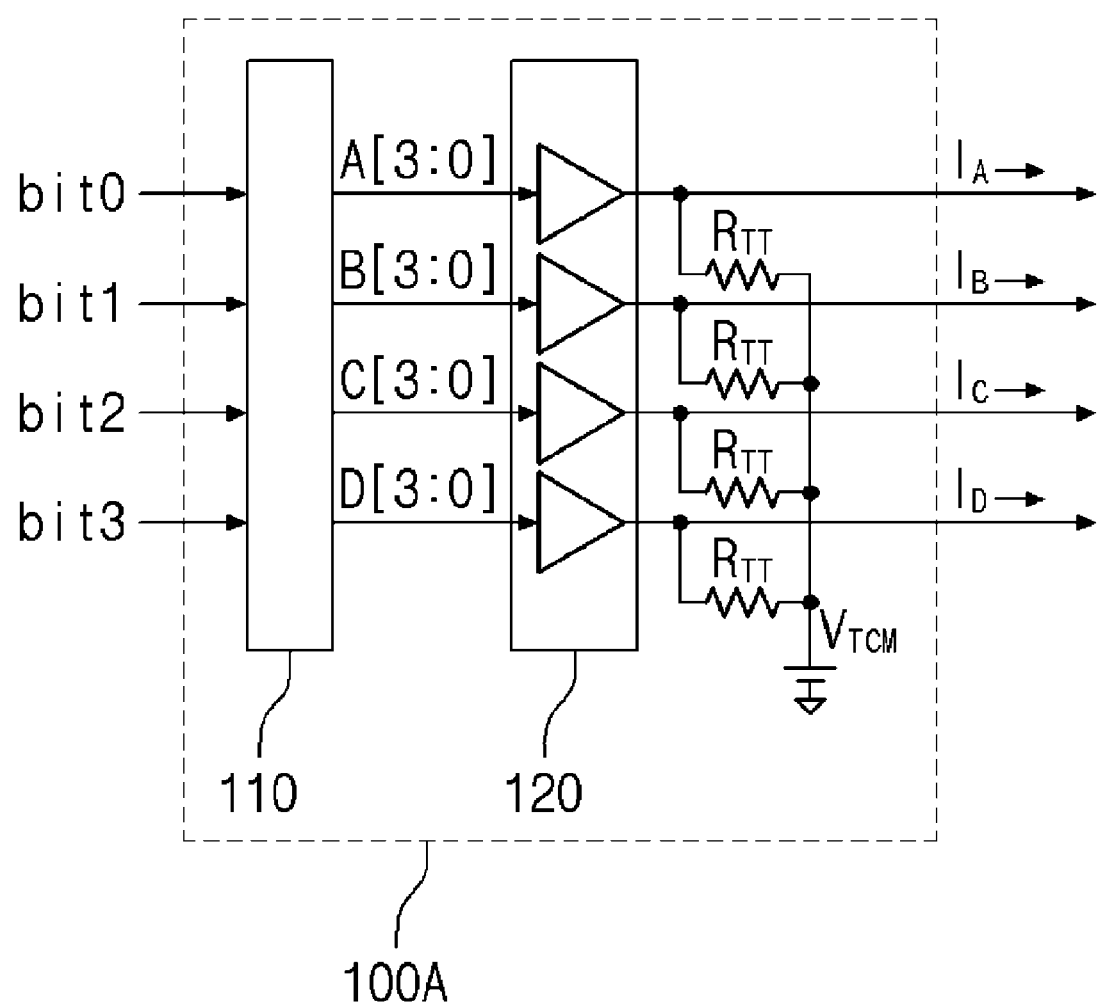
FIG. 8 illustrates a data transmission apparatus of FIG. 1 in accordance with another embodiment of the present disclosure.

FIG. 8 is a block diagram illustrating a data transmission apparatus 100A in accordance with another embodiment of the present disclosure.

The data transmission apparatus 100A includes a voltage source $V_{TCM}$ and termination resistors $R_{TT}$ installed at the respective output terminals of the transmission driver 120, in addition to the data transmission apparatus 100 of FIG. 1. The descriptions of components in FIG. 8 that are the same as those of FIG. 1 are omitted herein.

The Tx signals $I_A$ to $I_D$ generated by the transmission driver 120 are controlled by the transmission-stage termination resistors $R_{TT}$ that are commonly connected to the voltage source $V_{TCM}$, and then transmitted through the transmission signal lines 300.

In the data transmission and reception system of FIG. 1, the termination resistors $R_T$ are included in the data reception apparatus 200, but are not included in the data transmission apparatus 100. In this case, since the output impedance of the data transmission apparatus 100 does not coincide with the characteristic impedance of the transmission signal lines 300, reflected waves may be generated in the data transmission apparatus 100. Although the data reception apparatus 200 includes the termination resistors $R_T$, values of the termination resistors $R_T$ may be changed in a range of +30% to −30%. Thus, the reflected waves generated in the data transmission apparatus 100 may have an influence on an input signal of the data reception apparatus 200. Thus, in order to increase a data transmission rate, the data transmission apparatus 100A includes the termination resistors $R_{TT}$ as illustrated in FIG. 8.

In the embodiment of FIG. 8, the transmission-stage termination resistors $R_{TT}$ of the data transmission apparatus 100A can reduce reflected waves generated in the data transmission apparatus 100A.

In FIG. 8, currents of the current signals $I_A$ to $I_D$ output from the data transmission apparatus 100A may partly flow into the transmission-stage termination resistors $R_{TT}$. Thus, in accordance with the embodiment of FIG. 8, amounts of the currents of the current signals $I_A$ to $I_D$ transmitted to the data reception apparatus 200 may be reduced, compared to the embodiment of FIG. 1.

Thus, the magnitudes of the current signals $I_A$ to $I_D$ transmitted to the data reception apparatus 200 in accordance with the embodiment of FIG. 8 needs to be increased to compensate for the current reduction due to the termination resistors $R_{TT}$. For this purpose, currents through the current sources 121 to 124 included in the transmission driver 120 in FIG. 6 need to be increased.

| Input data | | | | Current levels of Tx signal lines | | | | Decoded data | | | | | |
|---|---|---|---|---|---|---|---|---|---|---|---|---|---|
| bit3 | bit2 | bit1 | bit0 | $I_A$ | $I_B$ | $I_C$ | $I_D$ | $O_1$ | $O_2$ | $O_3$ | $O_4$ | $O_5$ | $O_6$ |
| 0 | 0 | 0 | 0 | −1.5I | −0.5I | +0.5I | +1.5I | 0 | 0 | 0 | 1 | 0 | 0 |
| 0 | 0 | 0 | 1 | −1.5I | −0.5I | +1.5I | +0.5I | 0 | 0 | 1 | 1 | 0 | 0 |
| 0 | 0 | 1 | 0 | −0.5I | −1.5I | +0.5I | +1.5I | 1 | 0 | 0 | 1 | 0 | 0 |
| 0 | 0 | 1 | 1 | −0.5I | −1.5I | +1.5I | +0.5I | 1 | 0 | 1 | 1 | 0 | 0 |
| 0 | 1 | 0 | 0 | −0.5I | +0.5I | +1.5I | −1.5I | 0 | 0 | 1 | 0 | 0 | 1 |

-continued

| Input data | | | | Current levels of Tx signal lines | | | | Decoded data | | | | | |
|---|---|---|---|---|---|---|---|---|---|---|---|---|---|
| bit3 | bit2 | bit1 | bit0 | $I_A$ | $I_B$ | $I_C$ | $I_D$ | $O_1$ | $O_2$ | $O_3$ | $O_4$ | $O_5$ | $O_6$ |
| 0 | 1 | 0 | 1 | −1.5I | +0.5I | +1.5I | −0.5I | 0 | 0 | 1 | 1 | 0 | 1 |
| 0 | 1 | 1 | 0 | −0.5I | +1.5I | +0.5I | −1.5I | 0 | 1 | 1 | 0 | 0 | 1 |
| 0 | 1 | 1 | 1 | −1.5I | +1.5I | +0.5I | −0.5I | 0 | 1 | 1 | 1 | 0 | 1 |
| 1 | 0 | 0 | 0 | +1.5I | −1.5I | −0.5I | +0.5I | 1 | 0 | 0 | 0 | 1 | 0 |
| 1 | 0 | 0 | 1 | +0.5I | −1.5I | −0.5I | +1.5I | 1 | 0 | 0 | 1 | 1 | 0 |
| 1 | 0 | 1 | 0 | +1.5I | −0.5I | −1.5I | +0.5I | 1 | 1 | 0 | 0 | 1 | 0 |
| 1 | 0 | 1 | 1 | +0.5I | −0.5I | −1.5I | +1.5I | 1 | 1 | 0 | 1 | 1 | 0 |
| 1 | 1 | 0 | 0 | +0.5I | +1.5I | −1.5I | −0.5I | 0 | 1 | 0 | 0 | 1 | 1 |
| 1 | 1 | 0 | 1 | +0.5I | +1.5I | −0.5I | −1.5I | 0 | 1 | 1 | 0 | 1 | 1 |
| 1 | 1 | 1 | 0 | +1.5I | +0.5I | −1.5I | −0.5I | 1 | 1 | 0 | 0 | 1 | 1 |
| 1 | 1 | 1 | 1 | +1.5I | +0.5I | −0.5I | −1.5I | 1 | 1 | 1 | 0 | 1 | 1 |

Table 4 shows an example of the levels of the current signals $I_A$ to $I_D$ transmitted to the transmission signal lines 300 when the current sources 121 to 124 of the transmission driver 120 of FIG. 6 are used and the transmission-stage termination resistors $R_{TT}$ are added to the data transmission apparatus 100A as illustrated in FIG. 8.

Referring to Table 4, the values of the currents transmitted to the data reception apparatus 200 are reduced to halves. Therefore, to compensate for the current reduction due to the termination resistors $R_{TT}$, the sizes of the current sources 121 to 124 need to be doubled.

Figure 9:
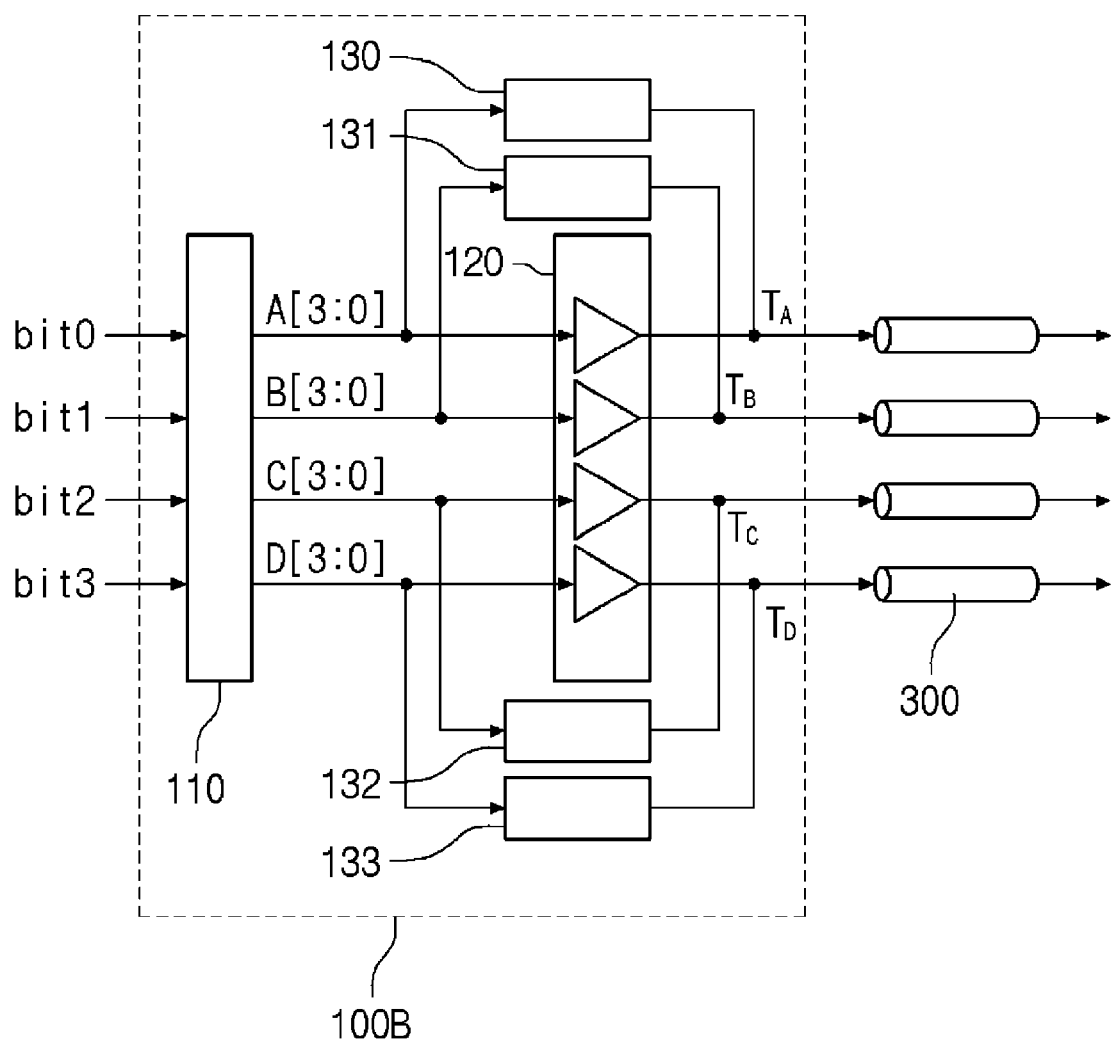
FIG. 9 illustrates the data transmission apparatus of FIG. 1 in accordance with still another embodiment of the present disclosure.

FIG. 9 is a block diagram illustrating a data transmission apparatus 100B in accordance with still another embodiment.

Referring to FIG. 9, compared to the data transmission apparatus 100 of FIG. 1, the data transmission apparatus 100B further includes four equalizers 130 to 133 that are connected between input terminals of the transmission driver 120 and output terminals of the transmission driver 120, respectively, the output terminals being coupled to the transmission signal lines 300, that is, the respective single-ended signal lines, respectively.

The equalizers 130 to 133 output high-frequency signal components to the transmission signal lines 300 using the 4-bit data A[3:0], B[3:0], C[3:0] and D[3:0], and the high-frequency signal components are proportional to differential values of the current levels of the Tx signals output to the transmission signal lines 300 with respect to time. With regard to the data transmission apparatus 100B in FIG. 9, the detailed descriptions of the same components, as those of FIG. 1, are omitted herein.

The equalizers 130 to 133 may generate high-frequency components $T_A$ to $T_D$ corresponding to the Tx signals $I_A$ to $I_D$, respectively. The high-frequency components $T_A$ to $T_D$ of the respective equalizers 130 to 133 may be merged into the Tx signals $I_A$ to $I_D$ output from the transmission driver 120, and then be transmitted through the transmission signal lines 300.

For example, the four 4-bit data A[3:0], B[3:0], C[3:0], and D[3:0] converted by the encoder 110 are input to the transmission driver 120 and, at the same time, input to the equalizers 130 to 133, respectively.

In the data transmission and reception system of FIG. 1, when the Tx signals $I_A$ to $I_D$ are transmitted through the transmission signal lines 300, the transmission signal lines 300 have a similar frequency characteristic to a low pass filter, as a transmission distance increases. Thus, the high-frequency components of the Tx signals $I_A$ to $I_D$ received by the data reception apparatus 200 may have smaller ratio than low-frequency components of the Tx signals $I_A$ to $I_D$.

In accordance with the embodiment of FIG. 9, the transmission driver 120 outputs the 4-level current signals $I_A$ to $I_D$ having both low-frequency components and high-frequency components, and the equalizers 130 to 133 output the high-frequency components $T_A$ to $T_D$ which are proportional to the differential values of the 4-level current signals $I_A$ to $I_D$ of the transmission driver 120 with respect to time.

Thus, in accordance with the embodiment of FIG. 9, the high-frequency components of the output signals $I_A$ to $I_D$ of the data transmission apparatus 100B are reinforced by the high-frequency components $T_A$ to $T_D$. Thus, a data loss caused by the transmission signal lines 300 can be substantially reduced.

Figure 10:
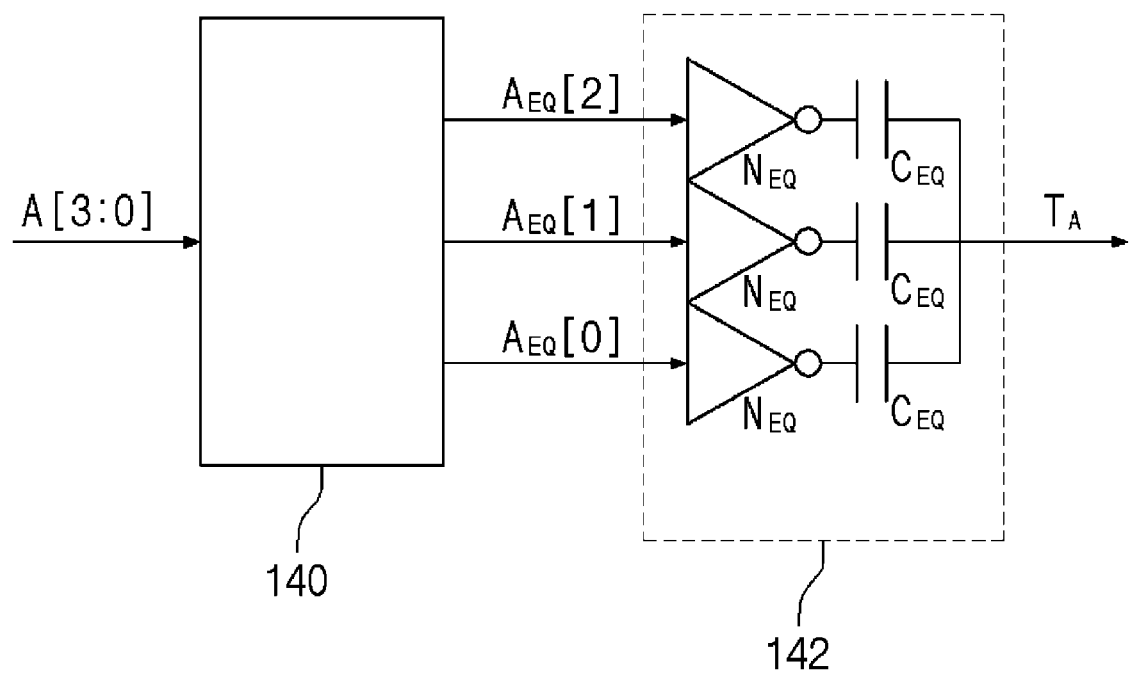
FIG. 10 illustrates an equalizer of FIG. 9 in accordance with an embodiment of the present disclosure.

FIG. 10 is a block diagram illustrating the equalizer 130 of FIG. 9 in accordance with an embodiment. Since the other equalizers 131 to 133 are configured and operate in the same manner as the equalizer 130 shown in FIG. 10, the descriptions of the other equalizers 131 to 133 are omitted herein.

The equalizer 130 includes an equalization data generator 140 and a high pass filter 142.

The equalization data generator 140 outputs 3-bit equalization data for expressing a level change of a Tx signal in response to 4-bit data.

The high pass filter 142 includes capacitors connected in parallel. As the respective bits of the 3-bit equalization data are transmitted in parallel to the capacitors, the high-pass filter 142 changes the number of capacitors applied in order to pass high-frequency signal components in response to the level change of the Tx signal.

More specifically, referring to FIG. 10, the equalization data generator 140 receives 4-bit data A[3:0], combines the received 4-bit data A[3:0], and outputs 3-bit equalization data $A_{EQ}[2:0]$, which is 3-bit binary data. Bits of the 3-bit equalization data $A_{EQ}[2:0]$ are transmitted in parallel to the high-pass filter 142.

The high-pass filter 142 outputs a high-frequency component $T_A$ of the 3-bit equalization data $A_{EQ}[2:0]$ to an output terminal connected to a corresponding transmission signal line 300.

The high-pass filter 142 includes three inverters $N_{EQ}$ and three capacitors $C_{EQ}$. The three inverters $N_{EQ}$ are connected in parallel and receive the 3-bit binary data $A_{EQ}[2:0]$, and the three capacitors $C_{EQ}$ are connected to output terminals of the respective inverters $N_{EQ}$, respectively.

The inverters $N_{EQ}$ invert the 3-bit binary data $A_{EQ}[2:0]$ received from the equalization data generator 140, and transmit the inverted data to the capacitors $C_{EQ}$ connected to the output terminals of the inverters $N_{EQ}$.

The capacitors $C_{EQ}$ pass the high-frequency component $T_A$ only when the data received from the inverters $N_{EQ}$ transitions from 0 to 1 (rising transition) or transitions from 1 to 0 (falling transition).

Thus, the output of the high-pass filter 142 changes the the ratio of high-frequency component, output from the transmission driver 120, according to the change of the 3-bit data $A_{EQ}[2:0]$.

Absolute magnitudes of the high-frequency components $T_A$ to $T_D$ transmitted through the equalizers 130 to 133 are determined by capacitance values of the capacitors $C_{EQ}$.

Figure 11:
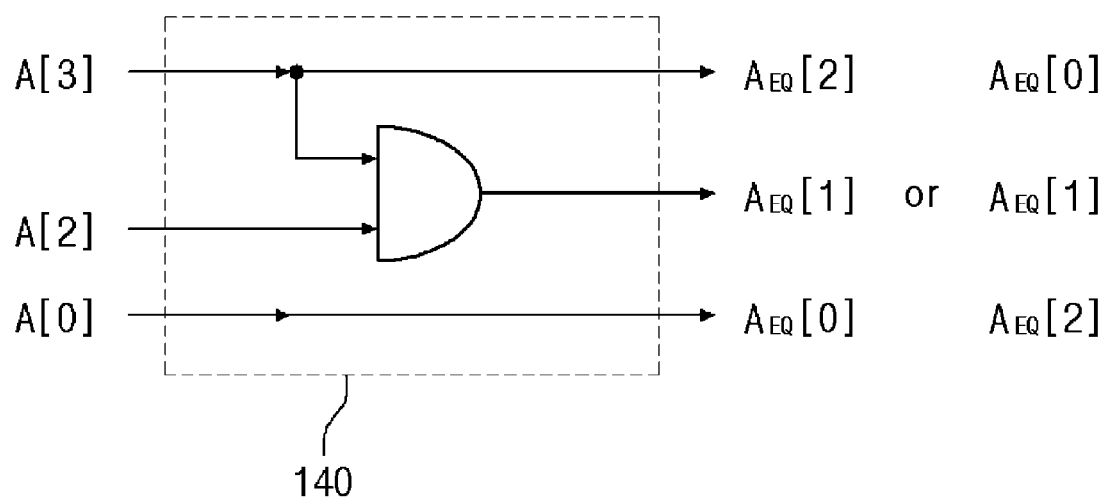
FIG. 11 illustrates an equalization data generator of FIG. 10 in accordance with an embodiment of the present disclosure.

FIG. 11 is a block diagram illustrating the equalization data generator 140 of FIG. 10 in accordance with an embodiment.

The equalization data generator 140 includes an AND gate. The equalization data generator 140 receives only 3 bits, e.g., A[3], A[2], and A[0], of the 4-bit data A[3:0], outputs the bits A[3] and A[0] as $A_{EQ}[2]$ and $A_{EQ}[0]$, respectively, performs an AND operation on the bits A[3] and A[2] using the AND gate, and outputs an output of the AND gate as $A_{EQ}[1]$.

In another embodiment, the equalization data generator 140 may receive only 3 bits, e.g., A[3], A[2], and A[0], of the 4-bit data A[3:0], output the bits A[3] and A[0] as $A_{EQ}[0]$ and $A_{EQ}[2]$, respectively, performs the AND operation on the bits A[3] and A[2] using the AND gate, and outputs the output of the AND gate as $A_{EQ}[1]$.

At this time, the bit A[1] of the 4-bit data A[3:0] is not used. Because of the above-described process, the equalization data generator 140 may combine the 4-bit data A[3:0] into the 3-bit data $A_{EQ}[2:0]$.

TABLE 5

| A[3] | A[2] | A[1] | A[0] | $A_{EQ}[2]$ | $A_{EQ}[1]$ | $A_{EQ}[0]$ | $T_A$ |
|---|---|---|---|---|---|---|---|
| 0 | 1 | 0 | 0 | 0 | 0 | 0 | +3 |
| 1 | 0 | 0 | 0 | 1 | 0 | 0 | +1 |
| 1 | 1 | 1 | 0 | 1 | 1 | 0 | −1 |
| 1 | 1 | 0 | 1 | 1 | 1 | 1 | −3 |

Table 5 shows an example of the high-frequency component $T_A$ output from the high-pass filter 142 of FIG. 10 and data combinations in which the 4-bit data A[3:0] input to the equalizer 130 is converted into the 3-bit data $A_{EQ}[2:0]$ by the equalization data generator 140 of FIG. 11.

For example, when the 4-bit data A[3:0] input to the equalization data generator 140 changes from "1101" to "1110", the 3-bit data $A_{EQ}[2:0]$ combined by the equalization data generator 140 may change from "111" to "110". Then, a value input to the three capacitors $C_{EQ}$ changes from "000" to "001". At this time, a value of one capacitor $C_{EQ}$ among the three capacitors $C_{EQ}$ transitions from "0" to "1" (rising transition). Thus, the rising high-frequency component $T_A$ passes only through the capacitor $C_{EQ}$ input with the data undergoing the value transition.

In accordance with the embodiments of the present disclosure, the data transmission apparatus, the data reception apparatus, and the data transmission and reception system can accomplish data transmission using the single-ended signaling, such that the number of data transmission lines and the number of pins included in a DRAM chip can be reduced.

Furthermore, a reception stage with a simple circuit configuration can be applied to the data reception apparatus and the data transmission and reception system, which transmit and receive data using a single-ended signaling method.

Furthermore, as current signals that have discrete levels corresponding to input data are transmitted through the single-ended signal lines, Tx signals may be less influenced by a supply voltage noise and EMI.

Furthermore, high-frequency components of Tx signals transmitted through the single-ended signal lines can be amplified to facilitate data restoration at the data reception apparatus.

Although various embodiments have been described for illustrative purposes, it will be apparent to those skilled in the art that various changes and modifications may be made without departing from the spirit and scope of the invention as defined in the following claims.

What is claimed is:

1. A data transmission apparatus, comprising:
an encoder configured to generate N N-bit data based on N binary data, where N is a natural number equal to or larger than 2; and
a transmission driver configured to generate N transmission (Tx) signals having discrete levels and corresponding to the N N-bit data, and output the N Tx signals to N single-ended signal lines,
wherein the transmission driver comprises first and second current sources and first and second sink current sources for generating the N Tx signals, and controls an output of a first current flowing through the first current source and the first sink current source and an output of a second current flowing through the second current source and the second sink current source, in response to each of the N N-bit data, and
wherein the transmission driver outputs the sum of the first and second currents as a corresponding each of the N Tx signals.

2. The data transmission apparatus of claim 1, wherein the encoder converts the N binary data into the N N-bit data using balance coding, the N N-bit data having different values such that the sum of the N Tx signals becomes substantially zero in a steady state.

3. The data transmission apparatus of claim 1, wherein the transmission driver generates the N Tx signals to have different values in a steady state.

4. The data transmission apparatus of claim 1, wherein the N Tx signals are current signals.

5. The data transmission apparatus of claim 1, wherein the encoder generates four 4-bit data based on four binary data, the four 4-bit data having different values.

6. The data transmission apparatus of claim 1, wherein the transmission driver generates the N Tx signals, the N Tx signals being separated by a uniform difference.

7. The data transmission apparatus of claim 5, wherein the transmission driver further comprises four switch sets, each switch set including four switches, the transmission driver generating four Tx signals using the first and second current sources and the first and second sink current sources, the four Tx signals having four different levels and corresponding to the four 4-bit data, respectively,
wherein first and second switches of each switch set operate in response to two bits of a corresponding one of the four 4-bit data in order to control the output of the first current flowing through the first current source and the first sink current source, and
wherein third and fourth switches of said each switch set operate in response to the other two bits of the corresponding one of the four 4-bit data in order to control the output of the second current flowing through the second current source and the second sink current source.

8. The data transmission apparatus of claim 1, further comprising N equalizers connected between input terminals of the transmission driver corresponding to the respective N-bit data and the single-ended signal lines corresponding to the respective N Tx signals, respectively, wherein each of the N equalizers outputs a high-frequency signal component to a corresponding single-ended signal line using a corresponding N-bit data, and the high-frequency signal component is proportional to a differential value of a current level of a corresponding Tx signal output to the corresponding single-ended signal line with respect to time.

9. The data transmission apparatus of claim 8, wherein each of the N equalizers comprises:

an equalization data generator configured to output (N-1)-bit equalization data, which represents a level change of the corresponding Tx signal, based on the corresponding N-bit data; and a high-pass filter comprising capacitors connected in parallel, the capacitors outputting the high-frequency signal component in response to the level change of the corresponding Tx signal, wherein, as the respective bits of the (N-1)-bit equalization data are transmitted in parallel to the capacitors, the high-pass filter changes the number of capacitors applied in order to pass the high-frequency signal component.

10. A data transmission and reception system, comprising:

a data transmission apparatus configured to generate N Tx signals having discrete levels using N binary data, and output the N Tx signals to N single-ended signal lines, respectively, where N is a natural number equal to or larger than 2; and a data reception apparatus configured to receive the N Tx signals transmitted through the N single-ended signal lines, and restore the N binary data by comparing the received N Tx signals to each other, wherein the data transmission apparatus comprises:

an encoder configured to generate N N-bit data based on the N binary data; and a transmission driver configured to generate the N Tx signals corresponding to the N N-bit data, and output the N Tx signals to the N single-ended signal lines, respectively, wherein the data reception apparatus comprises:

a reception driver configured to receive the N Tx signals being transmitted through the N single-ended signal lines, and to generate decoded data having a bit number corresponding to the number of all cases in which the N Tx signals are compared to each other; and a decoder configured to restore the N binary data by combining bits of the decoded data, and wherein the data transmission and reception system further comprises:

N equalizers connected between input terminals of the transmission driver corresponding to the respective N-bit data and the N single-ended signal lines corresponding to the respective N Tx signals, respectively, wherein each of the N equalizers outputs a high-frequency signal component to a corresponding single-ended signal line using a corresponding N-bit data, and the high-frequency signal component is proportional to a differential value of a current level of a corresponding Tx signal output to the corresponding single-ended signal line with respect to time.

11. The data transmission and reception system of claim 10, wherein the encoder converts the N binary data into the N N-bit data having different values with the correlation through balance coding, such that the sum of the N Tx signals becomes substantially zero in a steady state.

12. The data transmission and reception system of claim 10, wherein the transmission driver generates the N Tx signals to have different values in a steady state.

13. The data transmission and reception system of claim 10, wherein the encoder generates four 4-bit data based on four binary data, the four 4-bit data having different values.

14. The data transmission and reception system of claim 13, wherein the transmission driver comprises first and second current sources, first and second sink current sources and four switch sets, each switch set including four switches, the transmission driver generating four Tx signals using the first and second current sources and the first and second sink current sources, the four Tx signals having four discrete levels and corresponding to the four 4-bit data, respectively, wherein first and second switches of each switch set operate in response to two bits of a corresponding one of the four 4-bit data in order to control an output of a first current flowing through the first current source and the first sink current source, wherein third and fourth switches of said each switch set operate in response to the other two bits of the corresponding one of the four 4-bit data in order to control an output of a second current flowing through the second current source and the second sink current source, and wherein the sum of the first and second currents is output as a corresponding Tx signal.

15. The data transmission and reception system of claim 10, wherein the reception driver compares the N Tx signals to each other using differential comparators.

16. The data transmission and reception system of claim 10, wherein the reception driver receives four Tx signals, and generates 6-bit decoded data by comparing the four Tx signals to each other.

17. The data transmission and reception system of claim 16, wherein the decoder comprises:

a first multiplexer configured to select one of first and second bits of the decoded data;

a second multiplexer configured to select one of third and fourth bits of the decoded data; and a logic circuit configured to perform an XOR operation on fifth and sixth bits of the decoded data, wherein outputs of the first and second multiplexers are determined in response to an output of the logic circuit, and wherein the outputs of the first and second multiplexers and the fifth and sixth bits are output as four binary data.

* * * * *